(12) United States Patent
Zamprogno et al.

(10) Patent No.: US 7,888,994 B2
(45) Date of Patent: Feb. 15, 2011

(54) DIFFERENTIAL TO SINGLE-ENDED CONVERSION CIRCUIT AND COMPARATOR USING THE CIRCUIT

(75) Inventors: Marco Zamprogno, Milan (IT); Pierangelo Confalonieri, Caponago (IT); Alberto Minuti, Piacenza (IT)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 12/395,409

(22) Filed: Feb. 27, 2009

(65) Prior Publication Data
US 2009/0219085 A1 Sep. 3, 2009

Related U.S. Application Data

(63) Continuation-in-part of application No. PCT/IT2006/000629, filed on Aug. 28, 2006.

(51) Int. Cl.
*G06G 7/12* (2006.01)
*G06G 7/26* (2006.01)

(52) U.S. Cl. .................... 327/563; 327/108; 327/65

(58) Field of Classification Search ............ 327/65–67, 327/560–563, 108; 330/252–253
See application file for complete search history.

(56) References Cited

U.S. PATENT DOCUMENTS

| | | | |
|---|---|---|---|
| 4,829,266 A * | 5/1989 | Pernici et al. ............... 330/253 |
| 4,885,484 A | 12/1989 | Gray | |
| 4,962,323 A * | 10/1990 | Ta ................................ 327/97 |
| 5,212,455 A * | 5/1993 | Pernici et al. ............... 330/253 |
| 5,581,212 A * | 12/1996 | Huang et al. ................. 330/253 |
| 6,286,127 B1 | 9/2001 | King et al. | |
| 6,326,846 B1 | 12/2001 | Brandt | |
| 6,396,733 B1 * | 5/2002 | Lu et al. ..................... 365/158 |
| 7,075,360 B1 | 7/2006 | Holloway et al. | |
| 2001/0007443 A1 | 7/2001 | Ono | |
| 2005/0258998 A1 | 11/2005 | Confalonieri et al. | |
| 2007/0236281 A1 * | 10/2007 | Cicalini ...................... 327/553 |

* cited by examiner

*Primary Examiner*—Quan Tra
(74) *Attorney, Agent, or Firm*—Timothy L. Boller; Seed IP Law Group PLLC (57) ABSTRACT

An electrical circuit for conversion from differential to single-ended includes a differential amplifier stage and first and second buffer circuits. The differential amplifier stage includes a first and a second input; and a first and a different second charging circuit that can be operatively coupled, respectively, with an output of the conversion circuit and with an auxiliary output. Each of the first and second buffer circuits is functionally arranged between one of said outputs and between one of said charging circuits. The buffer circuits being configured so as to substantially equalize relative impedances seen towards said outputs.

16 Claims, 4 Drawing Sheets

FIG. 3 ated technology comprises a sequence of differential
DIFFERENTIAL TO SINGLE-ENDED CONVERSION CIRCUIT AND COMPARATOR USING THE CIRCUIT

CROSS-REFERENCE TO RELATED APPLICATION

This application is a continuation-in-part of PCT Patent Application No. PCT/IT2006/000629, filed Aug. 28, 2006, now pending, which application is incorporated herein by reference in its entirety.

BACKGROUND

1. Technical Field

The present disclosure concerns a differential to single-ended conversion circuit and a multi-stage comparator using the circuit.

2. Description of the Related Art

A known multi-stage comparator, made in MOS (Metal Oxide Semiconductor) or CMOS (Complementary MOS) integroperational stages continuously decoupled from each other through capacitors. Each stage can be placed in reset, i.e. taken into the closed loop stage, through suitable switches. The operation of the comparator is articulated in two very distinct steps.

In the reset step, the operational stages are reset so as to reach the best bias condition: the terminals of the decoupling capacitors are forced to a common mode voltage dependent upon the topology of the operational elements. This step, amongst other things, allows the offset voltages of the operational elements themselves to be stored in the decoupling capacitors so as to carry out the well known auto-zero procedure.

At the end of the reset step the switches are opened and the operational elements can become offset through the signal present in input: each stage, through the decoupling capacitors, reads the variation of the outputs of the previous stage.

The output of the comparator is a logic signal: therefore the differential information of the last operational stage is converted into single-ended information.

The preferred solution in the prior art is that of introducing a single-ended operational, also continuously decoupled from the previous stage and equipped with its own reset switches, made through MOSFET (MOS Field Effect Transistor) devices.

BRIEF SUMMARY

The Applicant has observed that the performances and reliability of the multi-stage converters of the prior art have limitations. In particular, the Applicant has found that the limitations of conventional multi-stage comparators are, in part, caused by the conventional circuit for conversion from differential to single-ended. Even more specifically, the Applicant has found that such limitations depend upon the phenomenon of feedthrough by the reset switches with which the single-ended operational element is provided.

One embodiment is a circuit for conversion from differential to single-ended alternative to the known ones and that, for example, has improved performance and reliability compared to those of the prior art.

One embodiment is a circuit for conversion from differential to single-ended as described in claim 1 and by preferred embodiments thereof defined in the attached claims 2 to 13.

Also forming the object of the present invention is a multi-stage comparator as defined by claim 14.

BRIEF DESCRIPTION OF THE SEVERAL VIEWS OF THE DRAWINGS

To better understand the invention and appreciate its advantages, some non-limiting example embodiments are described hereafter, with reference to the attached drawings, in which.

DETAILED DESCRIPTION

Structural Description

Figure 1:
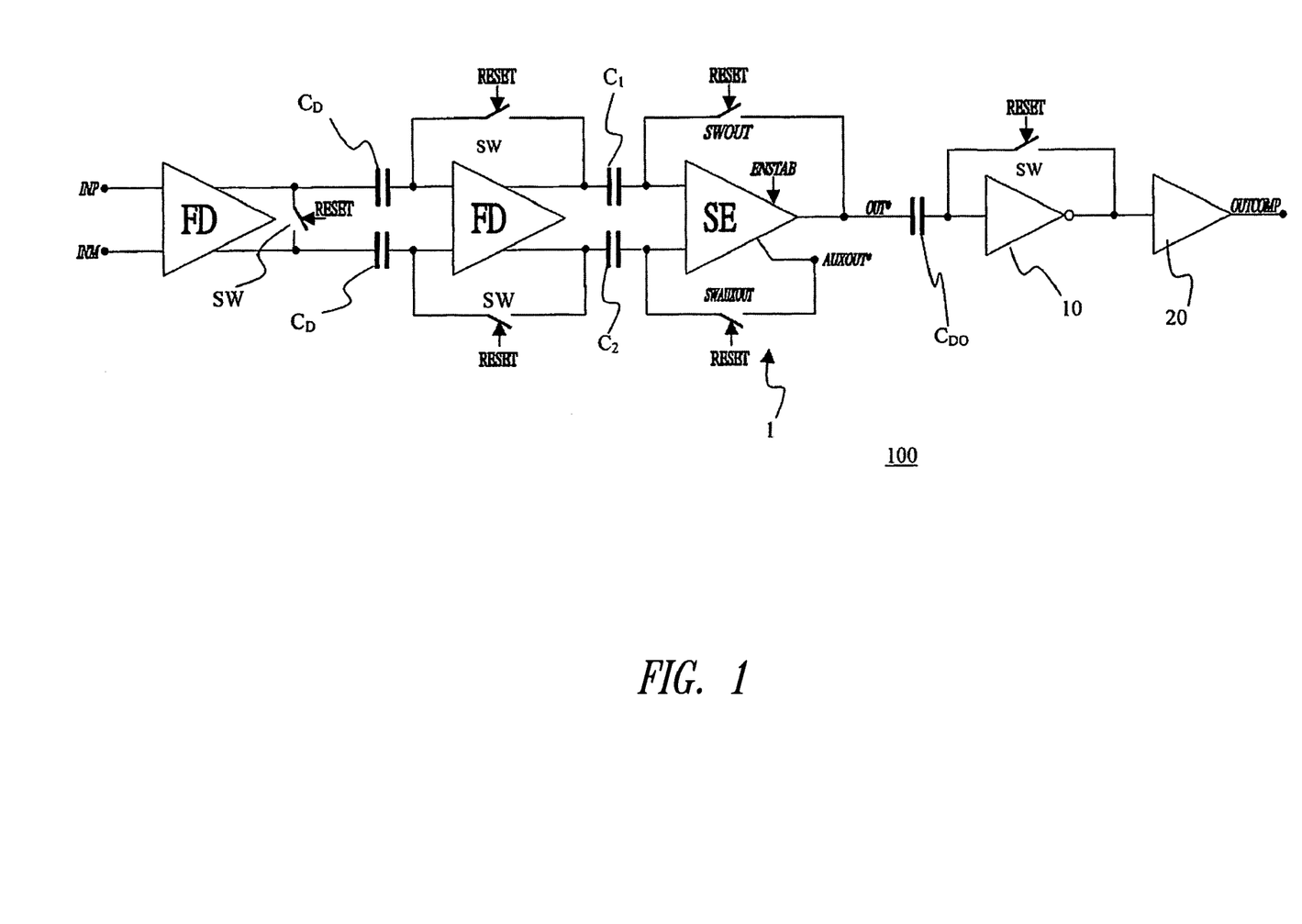
FIG. 1 schematically shows a multi-stage comparator according to one embodiment.

FIG. 1 schematically shows a multi-stage differential comparator circuit 100 (able to be made entirely in MOS or CMOS technology) comprising a pair of input terminals INP and INM. The comparator 100 compares the input signals at the terminals INP and INM establishing which of the two is greater than the other (i.e., equivalently, establishing the sign of the differential voltage INP-INM). The multi-stage comparator circuit 100 comprises a chain of fully differential stages FD (in the example two) continuously decoupled from each other through capacitors $C_D$.

Each differential stage FD comprises, for example, an operational amplifier, and can be made in the known folded-cascode configuration. Each stage FD can be reset in closed loop through suitable switches SW commanded by a reset signal RESET.

Such differential stages FD can be of the type known to the man skilled in the art and, therefore, they shall not be described in detail.

The comparator circuit 100 also comprises a single-ended circuit 1 of conversion from fully differential to single-ended (in short, single-ended circuit), connected to the outputs of the second fully differential stage FD, through a first and a second continuous decoupling capacitor C1 and C2, and provided with an output terminal OUT*.

The output terminal OUT* is connected, through a further decoupling capacitor $C_{DO}$, to an inverting stage 10 provided with a respective reset switch SW, and connected to an output buffer 20 provided with an output terminal OUTCOMP.

The comparator 100 is able to supply a binary signal on the output OUTCOMP that indicates whether the voltage applied to the input terminal INP is or is not greater than the voltage applied to the other terminal INM. The fully differential stages FD supply an amplification to control the single-ended circuit 1.

Figure 2A:
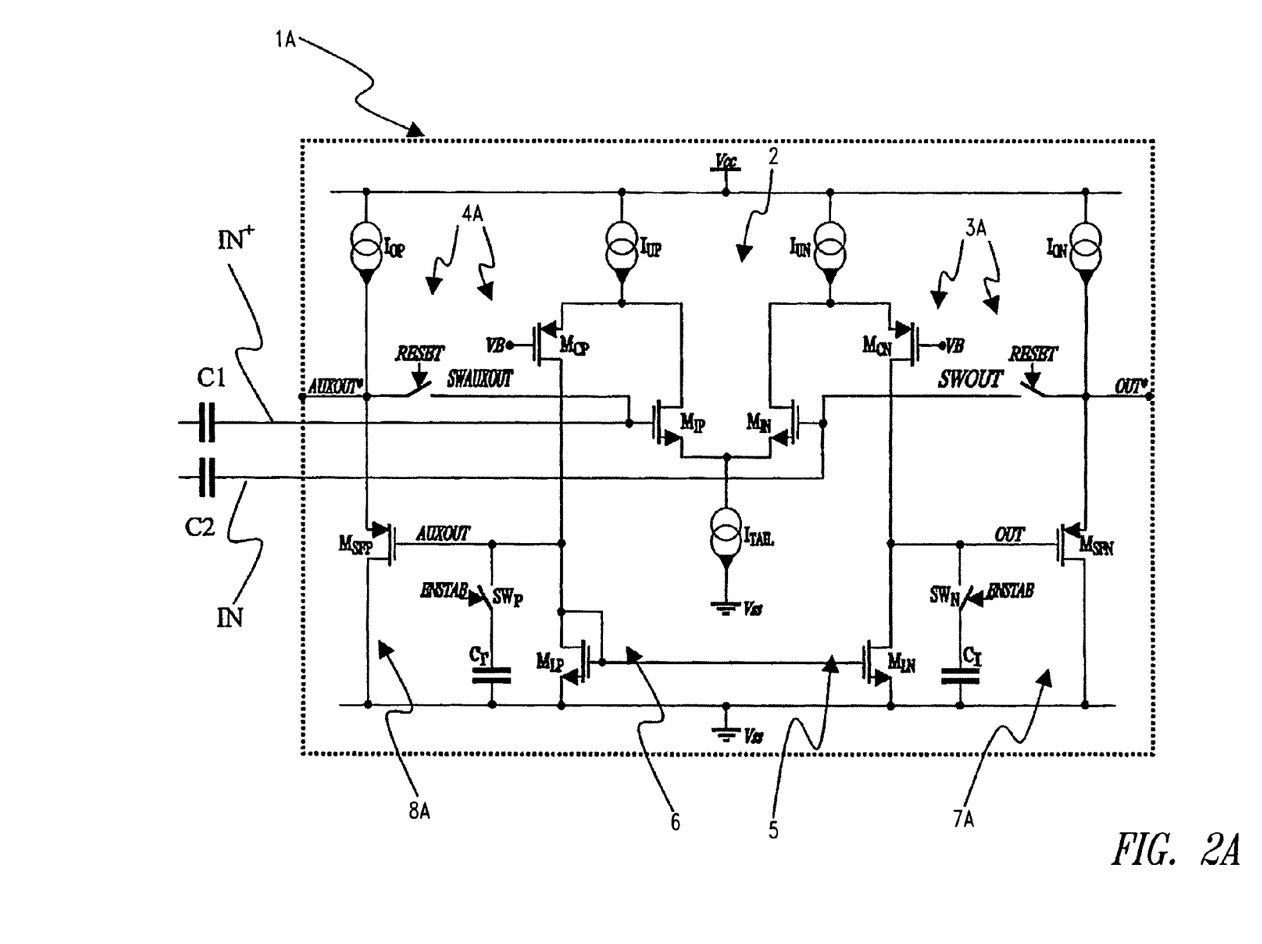
FIG. 2A schematically shows a circuit for conversion from differential to single-ended according to a first embodiment and included in said comparator.

FIG. 2A shows a first embodiment of a single-ended circuit 1A that can be employed in place of the single-ended circuit 1 of FIG. 1. In FIG. 2A and in the subsequent FIG. 3 analogous or identical stages, circuits and components are indicated with analogous or the same reference numerals.

The single-ended circuit 1A can be made, for example, in CMOS (Complementary MOS) technology and comprises, for example, a differential amplifier input stage 2. The differential amplifier input stage 2 includes a differential pair formed from the transistors $M_{IP}$ and $M_{IN}$ having a common source terminal connected to a current source $I_{TAIL}$ connected to a first supply voltage $V_{SS}$ (for example, the ground voltage). The drain terminals of the differential pair $M_{IP}$, $M_{IN}$ are connected to respective current sources $I_{UP}$ and $I_{IN}$ fed by a second supply voltage $V_{CC}$.

The gate terminal of the transistor $M_{IN}$ of the differential pair is, for example, the inverting input IN⁻ of the single-ended circuit 1A, whereas the gate terminal of the transistor $M_{IP}$ of the differential pair is, according to the example, the non-inverting input IN⁺ of the single-ended circuit 1A. The two inputs IN⁻ and IN⁺ are connected to the respective decoupling capacitors C1 and C2 of the continuous component.

The single-ended circuit 1A also comprises a first output circuit 3A connected to the drain terminal of the transistor $M_{IN}$ of the differential pair and provided with an output terminal OUT* that constitutes the single end of the single-ended circuit 1A.

Moreover, the single-ended circuit 1A is provided with a second output circuit 4A connected to the drain terminal of the transistor $M_{IP}$ of the differential pair and provided with an auxiliary output terminal AUXOUT*.

Also included in the single-ended circuit 1A are a first reset switch SWOUT coupled between the inverting input terminal IN⁻ and the output terminal OUT* and a second reset switch SWAUXOUT coupled between the non-inverting input terminal IN⁺ and the auxiliary output terminal AUXOUT* to connected/disconnect said output terminals OUT* AUXOUT* to/from said input terminals IN⁻ and IN⁺, respectively.

Going back to the first output circuit 3A, this comprises a first charging circuit 5 including, for example, a first cascode transistor $M_{CN}$ and a first charging transistor $M_{LN}$. The first cascode transistor $M_{CN}$ has a gate terminal suitable for receiving a suitable bias voltage VB, a source terminal connected to the output of said current source $I_{IN}$ (common to the drain terminal of the transistor $M_{IN}$ of the differential pair) and a drain terminal connected to another drain terminal of the first charging transistor $M_{LN}$ having a source terminal connected to the first supply voltage $V_{SS}$.

With reference to the second output circuit 4A, it is different in circuit from the first and is provided with a second charging circuit 6 including, for example, a second cascode transistor $M_{CP}$ and a second charging transistor $M_{LP}$. The second cascode transistor $M_{CP}$ has a gate terminal suitable for receiving the bias voltage VB, a source terminal connected to the output of said current source $I_{UP}$ (common to the drain terminal of the transistor $M_{IP}$ of the differential pair) and a drain terminal connected to another drain terminal of the second charging transistor $M_{LP}$ having a source terminal connected to the first supply voltage $V_{SS}$. The second charging transistor $M_{LP}$ has its own gate terminal connected to its drain terminal so as to take up the diode configuration. Moreover, the gate terminal of the second charging transistor $M_{LP}$ is connected to the gate terminal of the first charging transistor $M_{LN}$.

It should be observed that, according to the particular example described, the differential amplifier input stage 2 and the charging circuits 5 and 6 form a single-ended folded-cascode stage (using P-channel and N-channel transistors) that has a first intermediate output terminal OUT connected between the drain terminals of the first cascode transistor $M_{CN}$ and the charging transistor $M_{LN}$ and a second intermediate output terminal AUXOUT connected between the drain terminals of the second cascode transistor $M_{CP}$ and the charging transistor $M_{LP}$. As known, the single-ended folded-cascode configuration allows a high gain to be obtained suitable, for example, for use in a comparator.

Moreover, it should be noted that the first and second charging circuit 5 and 6 (and, therefore, also the respective output circuits 3A and 4A) are distinct from each other since they have a different circuit layout: the first charging transistor $M_{LN}$ offers a high output impedance whereas the second charging transistor $M_{LP}$ is in diode configuration and therefore offers a substantially low output impedance, lower than that of the transistor $M_{LN}$.

This asymmetry of the two charging circuits 5 and 6 is intrinsic to the single-ended topology of the stage 1A.

The first output circuit 3A is also provided with a first buffer circuit 7A comprising, in accordance with a first embodiment of the invention, a first buffer transistor $M_{SFN}$, for example, a P-channel MOSFET in source-follower configuration. In particular, such a first buffer transistor $M_{SFN}$ has a source terminal connected to a current source ION fed by the second supply voltage $V_{CC}$, a drain terminal connected to the first supply voltage $V_{SS}$ and a gate terminal connected to the aforementioned first intermediate output terminal OUT. The source terminal of the first buffer transistor $M_{SFN}$ has the output terminal OUT* of the single-ended circuit 1 connected to it.

The second output circuit 4A also includes a second buffer circuit 8A comprising, in accordance with the first embodiment of the invention, a second buffer transistor $M_{SFP}$, for example, a P-channel MOSFET in source-follower configuration. In particular, such a second buffer transistor $M_{SFP}$ has a source terminal connected to a current source Iop fed by the second supply voltage $V_{CC}$, a drain terminal connected to the first supply voltage $V_{SS}$ and a gate terminal connected to the aforementioned second intermediate output terminal AUXOUT. The source terminal of the second buffer transistor $M_{SFP}$ has the auxiliary output terminal AUXOUT* of the single-ended circuit 1A connected to it.

The first reset switch SWOUT can be commanded by the reset signal RESET and has a first terminal connected to the gate terminal of the transistor $M_{IN}$ (common to the inverting input IN⁻) of the differential pair and a second terminal connected to the output terminal OUT*.

The second reset switch SWAUXOUT can be commanded by the signal RESET and has a first terminal connected to the gate terminal of the transistor $M_{IP}$ (common to the non-inverting input IN⁺) of the differential pair and a second terminal connected to the auxiliary output terminal AUXOUT*.

Each of said first and second switch SWOUT and SWAUXOUT can be a transmission gate device (comprising a transistor PMOS and a NMOS connected in parallel) capable of operating as a switch based upon the command voltage (corresponding to the signal RESET) applied to its own gate terminal. The other switches included in the comparator 1A can be manufactured in a similar way.

The first buffer circuit 7A and the second buffer circuit 8A, irrespective of the particular source-follower configuration shown in FIG. 2, are such as to have impedances seen at the output terminals OUT* and AUXOUT* substantially the equal to each other. In the particular case shown here, such an impedance is given by an output impedance associated with the source-follower configuration.

Let us consider the expression of the output impedance $Z_{OUT*}$ of the first buffer circuit 7A in the source-follower configuration, expressed in the domain of the Laplace transform, $$Z_{OUT^*} = \frac{1}{g_m} \cdot \frac{[1 + s \cdot R_i \cdot (C_{GS} + C_i)]}{\left(1 + \frac{s \cdot C_{GS}}{g_m}\right) \cdot (1 + s \cdot R_i \cdot C_i)} \quad (1)$$

where:

$g_m$ and $C_{GS}$ are, respectively, the transconductance and the gate-source capacity of the first buffer transistor $M_{SFN}$;

$R_i$ and $C_i$ are, respectively, the equivalent resistance and capacitance present at the input of the first buffer transistor $M_{SFN}$.

Let us now consider the expression of the output impedance $Z_{AUXOUT^*}$ of the second buffer circuit 8A in the source-follower configuration, expressed in the domain of the Laplace transform, $$Z_{AUXOUT^*} = \frac{1}{g'_m} \cdot \frac{[1 + s \cdot R'_i \cdot (C'_{GS} + C'_i)]}{\left(1 + \frac{s \cdot C'_{GS}}{g'_m}\right) \cdot (1 + s \cdot R'_i \cdot C'_i)} \quad (2)$$

where:

$g'_m$ and $C'_{GS}$ are, respectively, the transconductance and the gate-source capacitance of the second buffer transistor $M_{SFP}$;

$R'_i$ and $C'_i$ are, respectively, the equivalent resistance and capacitance present at the input of the second buffer transistor $M_{SFP}$.

The transconductance $g_m$ and the gate-source capacitance $C_{GS}$ Of the first buffer transistor $M_{SFN}$ can be made equal (apart from inevitable constructive differences) to the transconductance $g'_m$ and the gate-source capacitance $C'_{GS}$ of the second buffer transistor $M_{SFP}$.

On the other hand, the equivalent resistance $R_i$ and the equivalent capacitance $C_i$, associated with the first buffer circuit 7A and the corresponding $R'_i$ and $C'_i$ at the second buffer circuit 8A, being dependent upon the relative charging circuits 5 and 6, are different from each other.

Despite this, the use of the buffer circuits 7A and 8A, as can be seen from the comparison of the relationships (1) and (2), allows a significant equalization of the output impedances $Z_{OUT^*}$ and $Z_{AUXOUT^*}$ to be obtained.

Irrespective of the source-follower configuration (which could even not be used) the buffer circuits 7A and 8A are configured so as to minimize (at the extreme, cancel out) the difference between the relative output impedances $Z_{OUT^*}$ and $Z_{AUXOUT^*}$. In particular, such buffer circuits 7A and 8A are such that the difference between the relative output impedances is less (preferably, much less) than the difference between the output impedances of the charging circuits 5 and 6 that can be evaluated at the intermediate output terminals OUT and AUXOUT.

According to a particularly preferred and non-limiting embodiment, the first output circuit 3A comprises a first additional capacitor $C_I$ arranged in input to the first buffer transistor $M_{SFN}$, i.e. connected between its gate terminal (common to the first intermediate output OUT) and to its drain terminal.

Moreover, in accordance with this particular non-limiting embodiment, the second output circuit 4A comprises a second additional capacitor $C_I'$ arranged in input to the second buffer transistor $M_{SFP}$, i.e. connected between its gate terminal (common to the second intermediate output AUXOUT) and to its drain terminal.

The first and the second capacitors $C_I$ and $C_I'$ have sufficiently high values so as to better equalize the two output impedances of expressions (1) and (2).

Indeed, the impedance associated with these two capacitors $C_I$ and $C_I'$ shall be sufficiently low as to reduce or render negligible the contribution of the equivalent magnitudes $R_i$, $C_i$ and $R'_i$, $C'_i$ due to the charging circuits 5 and 6, in the expressions of the output impedances $Z_{OUT^*}$ and $Z_{AUXOUT^*}$. Such impedances associated with the two capacitors $C_I$ and $C_I'$ are in parallel with the equivalent impedances due to the charging circuits 5 and 6.

The choice of the value of the capacitors $C_I$ and $C_I'$ is determined by the value of the capacitance $C_{GS}$ defined above and, above all, by the components in frequency of the feedthrough signal.

In particular, the capacitors $C_I$ and $C_I'$ shall be of decreasing value the more high-frequency components the feedthrough signal has. From the expressions that define the impedances $Z_{OUT}$ and $Z_{OUT^*}$ it can be worked out that with the increase of the capacitors $C_I$ and $C'_I$, which are in parallel with the equivalent capacitances $C_i$ and $C'_i$, the effect of the terms $R_i$ and $R'_i$, $C_i$ and $C'_i$ becomes negligible. In other words, as such additional capacitors provide an increasing equalizing effect of the impedances is obtained that makes the structure less sensitive to the spectral characteristics of the feedthrough.

In general, the values of the capacitors $C_I$ and $C_I'$ can be chosen as different on the two intermediate terminals OUT and AUXOUT.

It should be observed that the presence of the capacitors $C_I$ and $C_I'$ on the two intermediate terminals OUT and AUXOUT limits the band of the single-ended circuit 1 and therefore reduces its speed in comparison step. Advantageously, as shall be made clearer later on, such capacitors are not always kept connected to the respective charging circuit. For this purpose a first charging switch $SW_N$ (in MOS technology) and a second charging switch $SW_P$ are adopted, each commanded by the same signal ENSTAB. The first (second) charging switch $SW_N$ ($SW_P$) is connected between an end of the capacitor $C_I$ ($C_I'$) and said first (second) intermediate terminal OUT (AUXOUT).

Figure 2B:
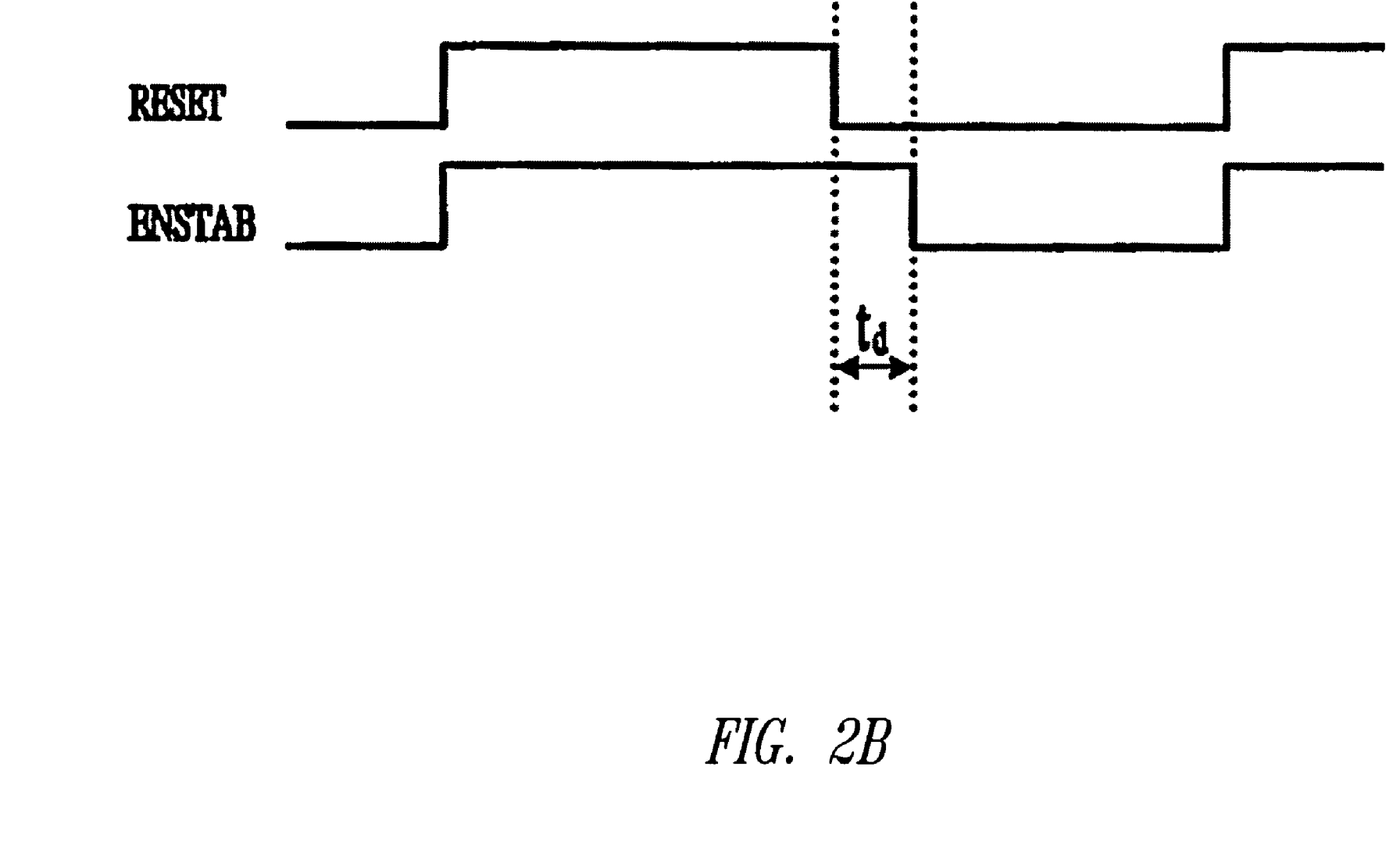
FIG. 2B shows progressions of signals RESET and ENSTAB that can be generated by a suitable source that operates based upon a clock signal.

FIG. 2B shows the progressions of the signals RESET and ENSTAB that can be generated by a suitable source (not shown) that operates based upon a clock signal.

Figure 3:
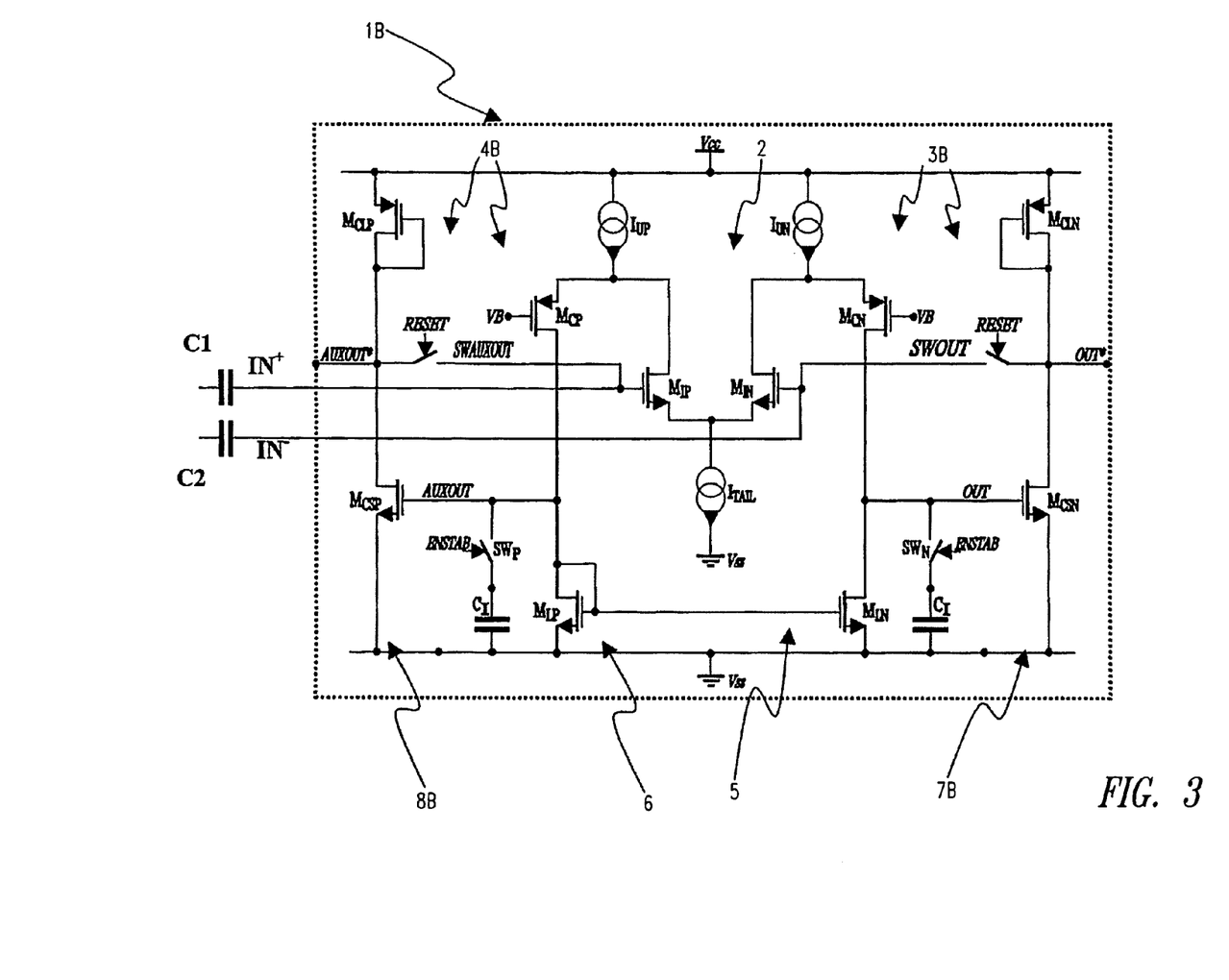
FIG. 3 schematically shows a circuit for conversion from differential to single-ended in accordance with a second embodiment.

FIG. 3 shows an alternative embodiment 1B that includes output circuits 3B, 4B with buffer circuits 7B, 8B that are not made through the source-follower configuration but through a common source configuration. In particular, the first buffer circuit 7B comprises an N-channel MOSFET transistor, $M_{CSN}$, having a source terminal connected to the first supply voltage $V_{SS}$ and a drain terminal connected to another drain terminal of a charging transistor $M_{CLN}$ in the diode configuration and having the respective source terminal connected to the second supply voltage $V_{CC}$.

The second buffer circuit 8B comprises a further N-channel MOSFET transistor, $M_{CSP}$, having a source terminal connected to the first supply voltage $V_{SS}$ and a drain terminal connected to another drain terminal of a charging transistor $M_{CLP}$ in the diode configuration and having the respective source terminal connected to the second supply voltage $V_{CC}$. Such buffer circuits of FIG. 3 can have a different gain of the unit that can be sized, within certain terms, according to the particular application.

Operation

The operation of the comparator 100 (provided with the single-ended circuit 1A of FIG. 2A) is articulated in two distinct steps. In a reset step, the signal RESET is high and the fully differential stages FD, the single-ended circuit 1A and the inverting stage 10 are reset since the relative switches SW, SWOUT and SWAUXOUT are closed and the corresponding output terminals are connected to the corresponding input terminals.

In this step the fully differential stages FD and the single-ended circuit 1 reach the best bias condition: the terminals of the decoupling capacitors $C_D$, C1 and C2 are forced at a voltage VCM dependent upon the topology of the operational elements used.

This reset step, moreover, allows the offset voltages of the operational elements of the corresponding stages to be stored in the decoupling capacitors $C_D$, C1 and C2 so as to carry out the well known auto-zero procedure.

With reference to FIG. 2A, during the reset step, the output terminal OUT* of the single-ended circuit is short-circuited at the inverting input IN⁻ whereas the non-inverting input IN⁺ is forced at low impedance connecting it to the auxiliary output terminal AUXOUT*.

At the end of the reset step the switches SW, SWOUT and SWAUXOUT are opened and a transition towards the comparing step occurs.

When these switches SW, SWOUT and SWAUXOUT open the known phenomenon of feedthrough occurs for each of them, for which reason there is injection of charge present in the channel and in the capacitances of the corresponding transistor MOS, from its terminals towards the inputs and the outputs of the corresponding stage. Such a charge is stored in the relative decoupling capacitors $C_D$, C1 and C2.

With reference to the single-ended circuit 1, the first reset switch SWOUT, opening, injects electrical charge towards the output terminal OUT* and therefore towards the capacitor C1 to which this terminal is connected. Similarly, the second reset switch SWAUXOUT, opening, injects electrical charge towards the auxiliary output terminal AUXOUT* and therefore towards the capacitor C2 to which it is connected.

The Applicant has observed that the way in which the electrical feedthrough charge of the switches spreads out towards the respective input or output depends precisely upon the impedances seen at the corresponding terminals of the switch.

In the specific case of the single-ended circuit 1A of FIG. 2A, the output impedances $Z_{OUT*}$ and $Z_{AUXOUT*}$ seen at the terminals OUT* and AUXOUT* by the respective switches SWOUT and SWAUXOUT are not very different thanks to the equalization action of the two buffer circuits 7 and 8 (see relationships (1) and (2)).

Therefore, the spreading of the electrical feedthrough charge between the decoupling capacitors C1 and C2 is sufficiently symmetrical. Therefore, substantially equal feedthrough charges shall be stored in the decoupling capacitors C1 and C2. This ensures that the single-ended circuit 1 is not subjected to a feedthrough signal that would make its outputs OUT* and AUXOUT* move before the propagation to its inputs IN⁻ and IN⁺ of the signal to be compared.

It should also be observed that the phenomenon of feedthrough for the fully differential stages FD is much less important that it is for single-ended stages. Indeed, for fully differential stages FD the contributions of charge injected towards the two respective inputs (and towards the two respective outputs) shall be substantially equal precisely thanks to the intrinsic circuit symmetry of the stages themselves. Therefore, the effect of the injections of charge on the capacitors $C_D$ of the fully differential stages FD is solely that of producing a common mode shift of the inputs and of the outputs that has practically no influence upon the comparing operation.

There can be constructive mismatches between the charging circuits of each fully differential stage FD connected to one of the capacitors $C_D$, C1 and C2. Such mismatches present in the fully differential stages are of the statistical type and can be minimized with conventional circuit sizing techniques.

Going back to the operation of the comparator 100 of FIG. 1, when one has entered that comparing step, the operational elements of each stage FD and the single-ended circuit 1 can become unbalanced through the signal in voltage present in input: each stage, through the decoupling capacitors present at its input, reads the variation of the outputs of the previous stage.

With regard to the single-ended circuit of FIG. 2A, in the comparing step, a balancing of the electrical currents absorbed by the transistors $M_{IP}$ and $M_{IN}$ of the differential pair takes place, dependent upon the value of the difference between the voltage signals applied to the inputs IN⁺ and IN⁻ and also applied to the gate terminals of the transistors themselves. Such unbalancing of the currents absorbed by the differential pair $M_{IP}$ and $M_{IN}$ causes a corresponding unbalancing between the currents that cross the two charging circuits 5 and 6, giving rise to different falls in potential. The presence of substantially equal electrical charge in the capacitors C1 and C2, due to the feedthrough of the switches SWOUT and SWAUXOUT, is seen by the differential pair $M_{IP}$ and $M_{IN}$ as a common mode signal that is, therefore, rejected.

The voltage present on the first intermediate output OUT of the first charging circuit 5 depends upon the value and sign of such unbalancing. The voltage present on the first intermediate output OUT is applied to the gate terminal of the first buffer transistor $M_{SFN}$ that consequently varies (substantially between the value $V_{SS}$ and the value $V_{CC}$) the voltage present on its source terminal and therefore on the output terminal OUT* of the single-ended circuit 1A.

The voltage present on the output terminal OUT* of the single-ended circuit 1A assumes a value that is read by the inverting stage 10, which (after the action of the output buffer 20) supplies the desired logic information (a 0 or a 1) onto the output OUTCOMB (FIG. 1).

At the end of this comparing step, the comparator 100 is once again taken into the reset state.

With reference to the optional use of the first and second additional capacitors $C_I$ and $C_I'$, such capacitors, as stated previously, increase the equalizing effect of the output impedances $Z_{OUT*}$ and $Z_{AUXOUT*}$ but, if they were present in the comparing step, would cause a limitation of the band of the single-ended circuit 1A and therefore would reduce its speed in the comparing step.

The signal ENSTAB visible in FIG. 2A ensures that each of the additional capacitors $C_I$ and $C_I'$ is connected between the terminal $V_{SS}$ and the relative terminal OUT or AUXOUT during the reset step and for a time period $t_D$ at the start of the comparing step. The time period $t_D$ is sufficient to exhaust the effect of the injection of feedthrough charge. After the time $t_D$, the signal ENSTAB opens the switches $SW_N$ and $SW_P$ disabling the additional capacitors $C_I$ and $C_I'$ so that for most of the time of the comparing step the differential amplifier 2 can work without the band limitation imposed by such additional capacitors.

As stated previously, at the end of the reset step the comparator 100 is once again taken into the reset step. If the duration of the comparing step is sufficiently brief, when the additional capacitors $C_I$ and $C_I'$ are reconnected to the intermediate output terminals OUT and AUXOUT at the start of the new reset step, the additional capacitors $C_I$ and $C_I'$ are already (substantially) charged at a normal operating voltage and shall have no influence upon the output terminal OUT*.

In the reset step it is possible that a small variation of the voltage at the ends of the additional capacitors $C_I$ and $C_I'$ due to the leakage of charge and another variation (also small) associated with the injection of feedthrough charge at the opening of the switches $SW_N$ and $SW_P$ controlled by the signal ENSTAB. Therefore, such capacitors alter the speed of the reset step to a limited extent.

With regard to the circuit of FIG. 3, its operation is analogous to that of the circuit of FIG. 2A and therefore shall not be described any further.

Advantages

The teachings of the present disclosure are advantageous since they allow conversion circuits from fully differential to single-ended to be obtained having an output terminal and an auxiliary output terminal characterized by equivalent impedances that are substantially equal or, in any case, with a small difference. This is particularly useful in the use of such single-ended circuits inside multi-stage comparators, such as the comparator 100 described above, in which problems associated with the feedthrough effect of the reset switches occur should there be a difference in impedance of the nodes towards which the feedthrough charge is injected.

It is important to observe that in the operational stages of conversion from differential to single-ended of the prior art (which do not use buffer circuits to equalize the output impedances) the phenomenon of feedthrough is present and have particularly harmful effects upon the operation of the entire comparator.

Indeed, in the decoupling capacitors present at the input of the known single-ended stage significantly different feedthrough charges shall be stored. Therefore such a stage shall inevitably see a feedthrough signal that will make its outputs move before the propagation to its inputs of the signal to be compared.

Moreover, it should be noted that the single-ended stage is the last of the multi-stage chain (and therefore the propagation time of the signal to its inputs shall be rather high) and its gain and band performance are, typically, designed to ensure the desired comparison speed. Consequently, in comparators of the prior art, the output of the single-ended stage often manages to saturate towards ground or towards the supply well before the arrival of the signal to be compared.

Leaving the condition of good bias (reset state), the response of the stage to the arrival of the signal can be significantly slow and can consequently become the limiting factor to the overall speed of the comparator.

The comparator described above, which uses buffer circuits for equalizing the output impedances, allows higher comparing speeds to be obtained with respect to conventional comparators, being more reliable in the comparison carried out.

Moreover, the preferred solution that uses the additional capacitors $C_I$ and $C_I'$ together with the switches $SW_N$ and $SW_P$ is particularly advantageous because it increases the equalization effect of the impedances of the buffer circuits without having disadvantages in terms of limitation of the comparing speed.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A differential to single conversion circuit, comprising:
a primary output terminal and an auxiliary output terminal;
first and second input terminals;
a differential amplifier stage coupled between the input terminals and output terminals, and between first and second supply terminals;
a first charging circuit having first and second charging switches coupled between the first and second supply terminals, the first and second charging switches being coupled to each other at a first intermediate node;
a second charging circuit having third and fourth charging switches coupled between the first and second supply terminals, the third and fourth charging switches being coupled to each other at a second intermediate node, the fourth charging switch having a lower impedance than the second charging switch;
a first buffer circuit coupled between the first and second supply terminals, the first buffer circuit including a first buffer switch coupled between the second supply terminal and the primary output terminal and having a control terminal coupled to the first intermediate node;
a second buffer circuit coupled between the first and second supply terminals, the second buffer circuit including a second buffer switch coupled between the second supply terminal and the auxiliary output terminal and having a control terminal coupled to the second intermediate node;
a first reset switch coupled between the first input terminal and the primary output terminal; and
a second reset switch coupled between the second input terminal and the auxiliary output terminal.

2. The differential to single conversion circuit of claim 1, wherein the first buffer circuit includes a first current source coupled between the first supply terminal and the primary output terminal and the second buffer circuit includes a second current source coupled between the first supply terminal and the auxiliary output terminal.

3. The differential to single conversion circuit of claim 1, wherein the first buffer circuit includes a first diode coupled between the first supply terminal and the primary output terminal and the second buffer circuit includes a second diode coupled between the first supply terminal and the auxiliary output terminal.

4. The differential to single conversion circuit of claim 1, further comprising:
a first capacitor coupled between the second supply terminal and the first intermediate node; and
a second capacitor coupled between the second supply terminal and the second intermediate node.

5. The differential to single conversion circuit of claim 4, further comprising:
a first enable switch coupled between the first capacitor and the first intermediate node; and
a second enable switch coupled between the second capacitor and the second intermediate node.

6. The differential to single conversion circuit of claim 1 wherein the first buffer circuit includes a first diode coupled transistor between the first supply terminal and the primary output terminal and the second buffer circuit includes a second diode coupled transistor between the first supply terminal and the auxiliary output terminal.

7. The differential to single conversion circuit of claim 6 wherein the first and second diode coupled transistors comprise diode-connected MOSFET transistors, respectively, having source terminals connected to the first supply terminal and drain terminals connected to the primary and auxiliary output terminals, respectively.

8. The differential to single conversion circuit of claim 1 wherein the buffer circuits are configured to substantially equalize a first impedance seen at the primary output terminal with a second impedance seen at the auxiliary output terminal.

9. The differential to single conversion circuit of claim 8 wherein the buffer circuits comprise MOSFET transistors, respectively, in source-follower configurations and said impedances are output impedances associated with the source-follower configurations.

10. The differential to single conversion circuit of claim 1 implemented in MOS or CMOS technology.

11. The differential to single conversion circuit of claim 1, further comprising:
first and second decoupling capacitors respectively connected to said inputs and configured to decouple the electrical circuit from an external circuit.

12. The differential to single conversion circuit of claim 11 wherein which each of said reset switches, when in a closed state, is configured to inject electrical charge towards the respective output terminal from the respective decoupling capacitor.

13. The differential to single conversion circuit of claim 1 wherein said differential amplifier stage and said charging circuits are connected to form a single-ended folded-cascode configuration.

14. The differential to single conversion circuit of claim 1, further comprising a first capacitor coupled between the first charging circuit and the first buffer circuit and a second capacitor coupled between said the second charging circuit and the second buffer circuit, the first capacitor being configured to substantially offset an impedance of said first charging circuit on a first output impedance seen towards said primary output terminal, and the second capacitor being configured to substantially offset an impedance of said second charging circuit on a second output impedance seen towards said auxiliary output terminal.

15. The differential to single conversion circuit of claim 14, further comprising:
a first enabling switch configured to connect/disconnect the first capacitor to/from the first buffer circuit; and
a second enabling switch configured to connect/disconnect the second capacitor to/from the second buffer circuit.

16. The differential to single conversion circuit of claim 15 wherein the enabling switches are configured to respectively connect the respective capacitors to the respective buffer circuits at least during a transition phase from a reset state, in which one of said inputs is connected to one of said outputs, to an operative state of the differential amplifier in which one of said inputs is disconnected from one of said outputs.

* * * * *